(12) United States Patent
Her

(10) Patent No.: US 9,716,115 B2
(45) Date of Patent: Jul. 25, 2017

(54) FLEXIBLE DISPLAY AND METHOD OF MANUFACTURING THE SAME

(71) Applicant: Samsung Display Co., Ltd., Yongin, Gyeonggi-do (KR)

(72) Inventor: Yong-Koo Her, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/805,127

(22) Filed: Jul. 21, 2015

(65) Prior Publication Data

US 2016/0211279 A1 Jul. 21, 2016

(30) Foreign Application Priority Data

Jan. 15, 2015 (KR) .......................... 10-2015-0007627

(51) Int. Cl.
| | | |
|---|---|---|
| *H01L 23/02* | (2006.01) | |
| *H01L 29/786* | (2006.01) | |
| *H01L 21/44* | (2006.01) | |
| *H01L 27/12* | (2006.01) | |
| *G02F 1/1345* | (2006.01) | |
| *H01L 27/32* | (2006.01) | |

(52) U.S. Cl.
CPC ...... *H01L 27/1244* (2013.01); *G02F 1/13452* (2013.01); *G02F 1/13458* (2013.01); *H01L 27/1218* (2013.01); *H01L 27/3276* (2013.01); *H01L 2251/5338* (2013.01)

(58) Field of Classification Search
CPC ............. H01L 27/1244; H01L 27/1218; H01L 27/1262; H01L 27/3267; G02F 1/13458; G02F 1/13452

USPC ............ 257/43, 68, 91, 686, 737, 778, 782, 257/E23.004, E23.069, E25.023, E29.273, 257/E21.409, E21.412, E21.495; 438/106, 612, 674, 795
See application file for complete search history.

(56) References Cited

U.S. PATENT DOCUMENTS

| | | | |
|---|---|---|---|
| 5,575,662 A * | 11/1996 | Yamamoto .............. | H01L 24/81 257/E21.511 |
| 6,172,422 B1 * | 1/2001 | Chigawa ............... | H01L 21/563 257/673 |
| 6,410,415 B1 * | 6/2002 | Estes ..................... | H01L 21/563 257/778 |

(Continued)

FOREIGN PATENT DOCUMENTS

| | | |
|---|---|---|
| JP | 2001-308505 A | 11/2001 |
| JP | 4793690 B2 | 8/2011 |
| KR | 10-2013-0053280 A | 5/2013 |

*Primary Examiner* — Dao H Nguyen

(74) *Attorney, Agent, or Firm* — Knobbe Martens Olson & Bear LLP

(57) ABSTRACT

A flexible display and method of manufacturing the same are disclosed. In one aspect, the display includes a flexible substrate including first concave bent portion and a pad formed over the first concave bent portion of the flexible substrate and including a second concave bent portion overlapping the first concave bent portion. The display further includes a connection pin electrically connected to the second concave bent portion. The connection pin has a central portion and a boundary portion surrounding the central portion. The height of the central portion is greater than that of the boundary portion.

9 Claims, 7 Drawing Sheets

(56) References Cited

U.S. PATENT DOCUMENTS

| | | | |
|---|---|---|---|
| 7,091,619 B2 * | 8/2006 | Aoyagi | H01L 23/49816 |
| | | | 257/686 |
| 7,214,962 B2 * | 5/2007 | Akram | H01L 23/13 |
| | | | 257/48 |
| 2014/0029230 A1 * | 1/2014 | Oh | H05K 1/14 |
| | | | 361/803 |

* cited by examiner

FLEXIBLE DISPLAY AND METHOD OF MANUFACTURING THE SAME

CROSS-REFERENCE TO RELATED APPLICATION

This application claims priority to and the benefit of Korean Patent Application No. 10-2015-0007627 filed in the Korean Intellectual Property Office on Jan. 15, 2015, the entire contents of which are incorporated herein by reference.

BACKGROUND

Field

The described technology generally relates to a flexible display and a method of manufacturing the same.

Description of the Related Technology

Standard techniques for mounting external circuitry, such as a data driving integrated circuit (IC), a gate driving IC, or the like, onto a display panel include tape automated bonding (TAB), chip-on-film (COF), chip-on-glass (COG), and the like.

In the COF technique, the IC or external circuitry is not directly attached to the display panel, but rather, the IC is first attached to a film and then the film structure is attached to a substrate.

In the COG technique, a connection pin of the is placed in direct contact with a pad of the display panel.

SUMMARY OF CERTAIN INVENTIVE ASPECTS

One inventive aspect is a flexible display and a method of manufacturing the same that can provide an electrical contact between a bump part and a pad.

Another aspect is a flexible display including: a flexible insulation substrate including a first concave type bent part; a pad part formed on the flexible insulation substrate and including a second concave type bent part corresponding to the first concave type bent part; and a bump part electrically connected to the second concave type bent part, wherein the bump part has a form in which a height of a central part thereof is higher than those of boundary parts thereof.

The bump part can have a shape in which the bump part is bent so as to correspond to the second concave type bent part.

The curvature of the central part can be less than those of the boundary parts.

The central part of the bump part can have a flat shape and the boundary parts thereof can form an oblique angle with the central part.

The central part and the boundary parts can be formed so as to be spaced apart from each other, the central part can be a functional bump part, and the boundary parts can be dummy bump parts.

The flexible display device can further include a plurality of conductive balls interposed between the bump part and the second concave type bent part.

The flexible display device can further include a plurality of conductive balls positioned on the second concave type bent part, wherein some of the plurality of conductive balls are interposed between the second concave type bent part and the central part so as to electrically connect the second concave type bent part and the central part to each other, and at least portions of the boundary parts are spaced apart from the conductive balls.

The flexible display device can further include a plurality of conductive balls positioned on the second concave type bent part, wherein a difference between the height of the central part and the heights of the boundary parts is less than the diameter of the conductive ball.

The flexible display device can further include an insulating layer formed on the pad part and including an opening corresponding to the second concave type bent part, wherein the hump part is placed in the opening.

Another aspect is a method of manufacturing a flexible display including: stacking an adhesive layer on a manufacturing substrate; stacking a flexible insulation substrate on the adhesive layer; stacking a pad part on the flexible insulation substrate; and stacking a circuit part on the insulating substrate, the circuit part including a bump part electrically connected to the pad part, wherein the adhesive layer contains a solid matter or a gel material.

The solid matter can be a beads spacer.

The manufacturing method of a flexible display device can further include stacking an insulating layer on the pad part and etching the insulating layer so as to form an opening exposing the pad part.

Another aspect is a flexible substrate including a first concave bent portion; a pad formed over the first concave bent portion of the flexible substrate and including a second concave bent portion overlapping the first concave bent portion; and a connection pin electrically connected to the second concave bent portion, wherein the connection pin has a central portion and a boundary portion surrounding the central portion, and wherein the height of the central portion is greater than that of the boundary portion.

In exemplary embodiments, wherein the end of the connection pin that is connected to the second concave bent portion has a shape that is substantially the same as that of the second concave bent portion. The central portion can have a curvature that is less than that of the boundary portion. The central portion can be substantially flat and the boundary portion can form an oblique angle with the central portion. The central portion and the boundary portion can be formed so as to be spaced apart from each other and the central portion can be electrically conductive and the boundary portion can be electrically insulative.

In exemplary embodiments, the flexible display further comprises a plurality of conductive particles interposed between the connective pin and the second concave bent portion. The flexible display can further comprise a plurality of conductive particles positioned on the second concave bent portion, wherein a subset of the conductive balls are interposed between the second concave bent portion and the central portion so as to electrically connect the second concave bent portion to the central portion, and wherein at least a portion of the boundary portion is spaced apart from the conductive particles.

In exemplary embodiments, the flexible display further comprises a plurality of conductive particles positioned on the second concave bent portion, wherein a subset of the conductive particles are interposed between the second concave bent portion and the central portion so as to electrically connect the second concave type bent portion to the central portion, and at least a portion of the boundary portion is spaced apart from the conductive particles. The flexible display can further comprise a plurality of conductive particles positioned on the second concave bent portion, wherein a difference in height between the central portion and the boundary portion is less than the diameter of the conductive particles. The flexible display can further comprise an insulating layer formed over the pad and including an opening overlapping the second concave bent portion, wherein the connection pin is placed in the opening.

Another aspect is a method of manufacturing a flexible display, comprising forming an adhesive layer over a substrate; forming a flexible substrate over the adhesive layer; forming a pad over the flexible substrate; and forming a display driver over the flexible substrate, wherein the display driver comprises a connection pin that is electrically connected to the pad, and wherein the adhesive layer contains a plurality of spacers.

In exemplary embodiments, the spacers are bead spacers. The method can further comprise forming an insulating layer over the pad and etching the insulating layer so as to form an opening exposing the pad.

According to at least one exemplary embodiment, the flexible display includes an electrical contact between the bump part and the pad part.

DETAILED DESCRIPTION OF CERTAIN INVENTIVE EMBODIMENTS

Figure 1:
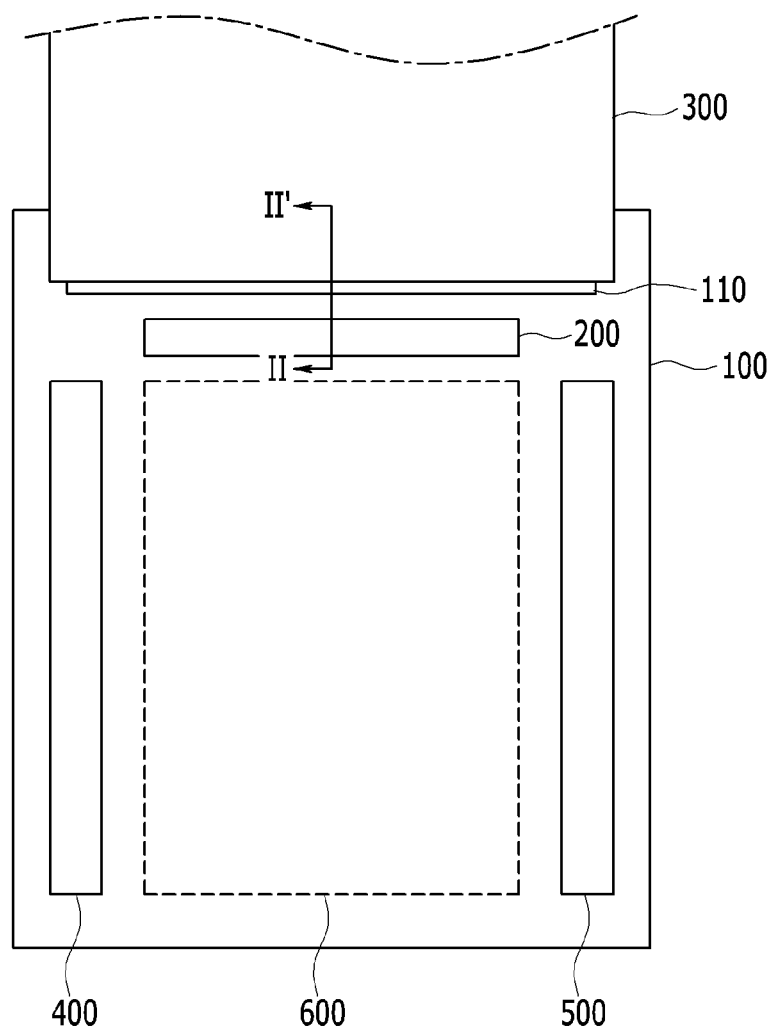
FIG. 1 is a diagram showing a display panel of a flexible display according to an exemplary embodiment.

Hereinafter, exemplary embodiments will be described with reference to the accompanying drawings. In the following description and the accompanying drawings, a detailed description for known functions or configurations will be omitted so as not to Obscure the gist of the described technology. In addition, it is to be noted that the same components are denoted by the same reference numerals in all of the accompanying drawings.

Exemplary embodiments stated in the present specification and configurations shown in the accompanying drawings are only exemplary embodiments and are not meant to limit the spirit of the described technology, it is to be understood that various equivalents and modifications can replace the exemplary embodiments and configurations shown in the accompanying drawings without departing from the spirit of the described technology. In addition, the terms "first", "second", and the like, which may be used in order to describe various components, are not used in order to limit these components, but are used only in order to distinguish one component from another component.

When using the chip on glass (COG) technique to attach external circuitry to a flexible display, contact defects may occur due to deformation of the flexible display substrate. However, it may still be desirable to use the COG technique since it has certain advantages over the more expensive chip-on-film (COF) technique. For example, the COF technique may require more area, increasing the panel size. Accordingly, a method of using the COG technique for establishing electrical connections between external circuitry and flexible displays is desirable.

Figure 2:
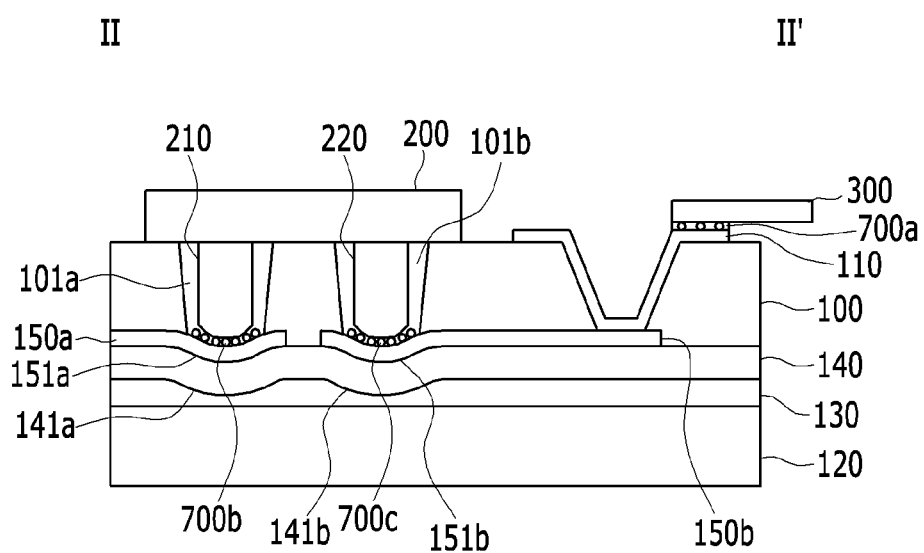
FIG. 2 is a cross-sectional view taken along line II-II' of FIG. 1.

FIG. 1 is a diagram showing a display panel of a flexible display according to an exemplary embodiment. FIG. 2 is a cross-sectional view taken along line II-II' of FIG. 1.

Referring to FIGS. 1 and 2, the display panel is divided into a display area 600 in which organic light-emitting diodes (OLEDs) or pixel electrodes contacting one surface of a liquid crystal layer are formed and a non-display area surrounding the display area 600.

A data driving integrated circuit (IC) or data driver 200, a gate driving IC or gate driver 400, a power supplying unit or power supply 500, a flexible printed circuit (FPC) 300, and the like, are positioned in the non-display area.

The data driving IC 200 supplies data signals to source terminals of thin film transistors (TFTs) of each pixel through a plurality of data lines extending in a vertical direction. The data driver IC 200 generates the data signals based on image data and control signals received from a timing controller (not shown).

The gate driving IC 400 supplies scan signals synchronized with the data signals to gate terminals of the thin film transistors of each pixel through a plurality of scan lines. The gate driving IC 400 generates the scan signals based on control signals received from the timing controller.

The power supplying unit 500 can be configured to supply voltages to electrodes of the OLEDs, and to supply reference voltages, other control signals, and the like to the pixels. The power supplying unit 500 can be an optical component and may not be included in the display when embodied as an LCD.

The FPC 300 can apply external signals to the display panel and can be connected to a second pad part or second pad 150b through an auxiliary pad part or auxiliary pad 110.

The auxiliary pad part 110 protects the second pad part 150b from the environment to prevent the second pad part 150b from being corroded and additionally performs an electrical connection role.

Although the auxiliary pad part 110 has been shown as if it is continuous in FIG. 1, the auxiliary pad part 110 is appropriately patterned in order to electrically connect the FPC 300 to the gate driving IC 400, the data driving IC 200, and the power supplying unit 500.

In addition, although the embodiment of FIGS. 1 and 2 illustrates the auxiliary pad part 110 as being connected to the second pad part 150b, the auxiliary pad part 110 can also be connected to another electrode layer formed in the middle of an insulating layer 100 through a contact hole.

The data driving IC 200 is electrically connected to the FPC 300 through the second pad part 150b and a second bump part or second connection pin 220. In addition, the data driving IC 200 is electrically connected to a data line of the display panel through a first bump part or first connection pin 210 and a first pad part or first pad 150a. The first bump part 210 and the second bump part 220 are respectively placed in openings 101a and 101b defined in the insulating layer 100.

Although a connection relationship between the gate driving IC 400 and the power supplying unit 500 is not shown, the gate driving IC 400 and the power supplying unit 500 can be connected to each other in a manner similar to that of the data driving IC 200. Therefore, the shapes of bump parts 210 and 220 to be described below can be substantially the same as each other.

The first and second pad parts 150a and 150b, which are formed of a conductive material, can be patterned at substantially the same time as an electrode layer forming a gate line, an electrode layer forming a data line, or the like, and can be formed using the same material.

In addition, although only one insulating layer 100 has been shown on the first and second pad parts 150a and 150b, the insulating layer 100 can be formed to have a structure in which a plurality of insulating materials are stacked in order to separate a plurality of electrode layers interposed in the middle of the insulating layer 100 from each other.

Therefore, the relative positions and thicknesses of the first pad part 150a, the second pad part 150b, and the insulating layer 100 can be determined based on the type of display device employed, the location of the thin film transistors, the connection relationship between the thin film transistor, the gate line, and the data line, and the like, which are not absolute.

In addition, the insulating layer 100 shown in the accompanying drawings is an optional component. In another exemplary embodiment, the insulating layer 100 can perform a protection function or an insulation function of the thin film transistors or the OLEDs, or the like, in the display area, but can be patterned and may not be present in the pad area shown in FIG. 2.

Therefore, in an exemplary embodiment in which the insulating layer 100 is not present in the pad area, the openings 101a and 101b are not present, and there is no space to place the first and second bump parts 210 and 220 in the openings 101a and 101b.

In this exemplary embodiment, the heights of the first and second bump parts 210 and 220 are less than in the FIG. 2 embodiment and anisotropic conductive films (ACFs) are attached onto the entire surfaces of the first and second bump parts 210 and 220, such that the first and second bump parts 210 and 220 are bonded to the pad parts 150a and 150b.

Each of the auxiliary pad part 110 and the FPC 300, the first pad part 150a and the first bump part 210, and the second pad part 150b and the second bump part 220 are respectively electrically connected to each other through conductive balls or conductive particles 700a, 700b, and 700c. The conductive balls 700a, 700b, and 700c can be contained in the anisotropic conductive films.

Although a manufacturing substrate 120 and an adhesive layer 130 are shown, these are illustrated to show certain manufacturing processes and may be removed after the manufacture of the display panel is completed.

A flexible insulation substrate or flexible substrate 140 can be formed of a flexible plastic material such as polyimide, or the like.

Next, the structural characteristics of the described technology shown in FIG. 2 will be described.

Referring to FIG. 2, the flexible insulation substrate 140 includes first concave type bent parts 141a and 141b.

The first concave type bent parts 141a and 141b are portions of the flexible insulation substrate 140 that are deformed by pressure applied via the first and second bump parts 210 and 220 after the display panel is manufactured due to the mounting of the data driving IC 200.

In the process of mounting the data driving IC 200, the manufacturing substrate 120, which is a rigid substrate formed of a material such as polyethylene terephthalate (PET), or the like, is not deformed by the pressure.

However, since the adhesive layer 130 that adheres the manufacturing substrate 120 to the flexible insulation substrate 140 is flexible, the flexible insulation substrate 140 is deformed together with the adhesive layer 130.

The first and second pad parts 150a and 150b stacked on the flexible insulation substrate 150 include second concave type bent parts 151a and 151b formed at positions corresponding to the first concave type bent parts 141a and 141b.

Figure 7:
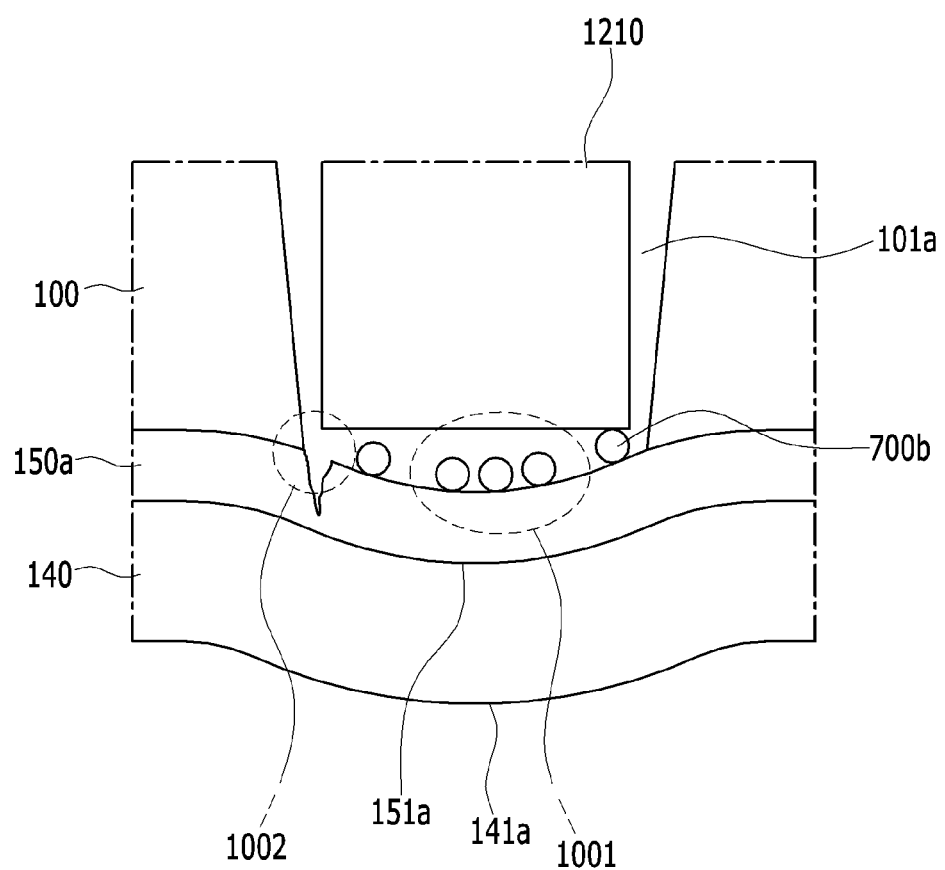
FIG. 7 is a diagram showing a rectangular bump part according to the standard art.

When a rectangular bump part 1210 according to the standard implementation is connected to the second concave type bent part 151a with the conductive balls 700 interposed therebetween, a contact defect 1001 may occur as shown in FIG. 7. In addition to the contact detect 1001, the pad part 150a may be damaged due to the concentration of pressure at an edge of the rectangular bump part 1210, such that a disconnection defect 1002 may occur.

Therefore, according to at least one exemplary embodiment, the shapes of the end portions of the bump parts 210 and 220 are changed to solve the above-mentioned contact defect 1001 and disconnection detect 1002.

Figure 3:
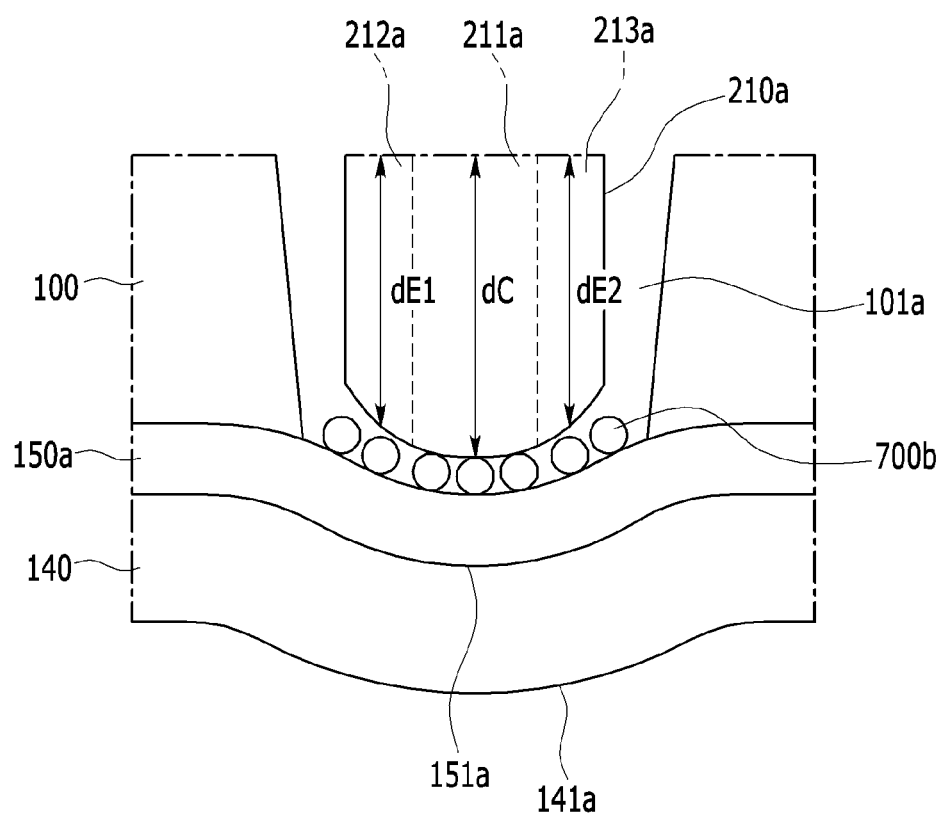
FIG. 3 is a diagram for describing the shape of a bump part.

FIG. 3 is a diagram for describing the shape of a bump part.

Referring to FIG. 3, an enlarged view of an area adjacent to an end portion of the first bump part 210a according to a first exemplary embodiment is shown. This shape may also be applied similarly to the second bump part 220, which is also similar in another exemplary embodiment below.

The first bump part 210a can be divided into a first boundary part 212a, a central part 211a, and a second boundary part 213a. The height dC of the central part 211a of the first bump part 210a is greater than the heights dE1 and dE2 of the first and second boundary parts 212a and 213b.

In a first exemplary embodiment, the first bump part 210a has a shape in which it is bent so as to correspond to the second concave type bent part 151a. Here, the curvature of the central part 211a can be configured so as to be less than that the first and second boundary parts 212a and 213a.

Therefore, a plurality of conductive balls 700b arranged on the second concave type bent part 151a can contact the central part 211a and may not contact the first and second boundary parts 212a and 213a.

As a result, in contrast to the rectangular bump part 1210 of FIG. 7, a portion of the edge of the first bump part 210a is removed, such that problems such as the contact defect 1001 and the disconnection defect 1002 can be prevented.

Figure 4:
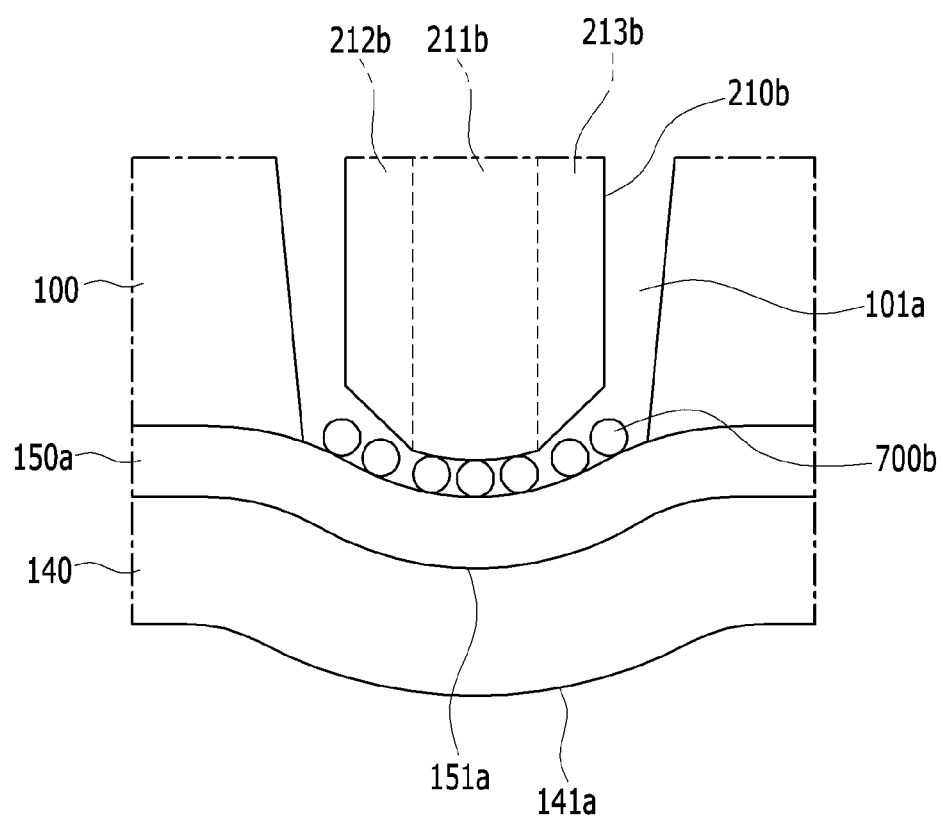
FIG. 4 is a diagram for describing the shape of a bump part according to a second exemplary embodiment.

FIG. 4 is a diagram for describing the shape of a bump part according to a second exemplary embodiment.

Referring to FIG. 4, an enlarged view of an area adjacent to an end portion of the first bump part 210b according to a second exemplary embodiment is shown.

The first bump part 210b can be divided into a first boundary part 211b, a central part 211b, and a second boundary part 213b. The height of the central part 211b of the first bump part 210b is greater than those of the first and second boundary parts 212b and 213b.

The central part 211b is substantially flat and the first and second boundary parts 212b and 213b form an oblique angle with the bottom of the central part 211b. The first and second boundary parts 212b and 213b can be represented as being chamfered.

Therefore, the conductive balls 700b can contact the central part 211b and may not contact the first and second boundary parts 212b and 213b.

As a result, in contrast to the rectangular bump part 1210 of FIG. 7, the edge of the first bump part 210b is removed such that the problems such as the contact defect 1001 and the disconnection defect 1002 can be prevented.

Figure 5:
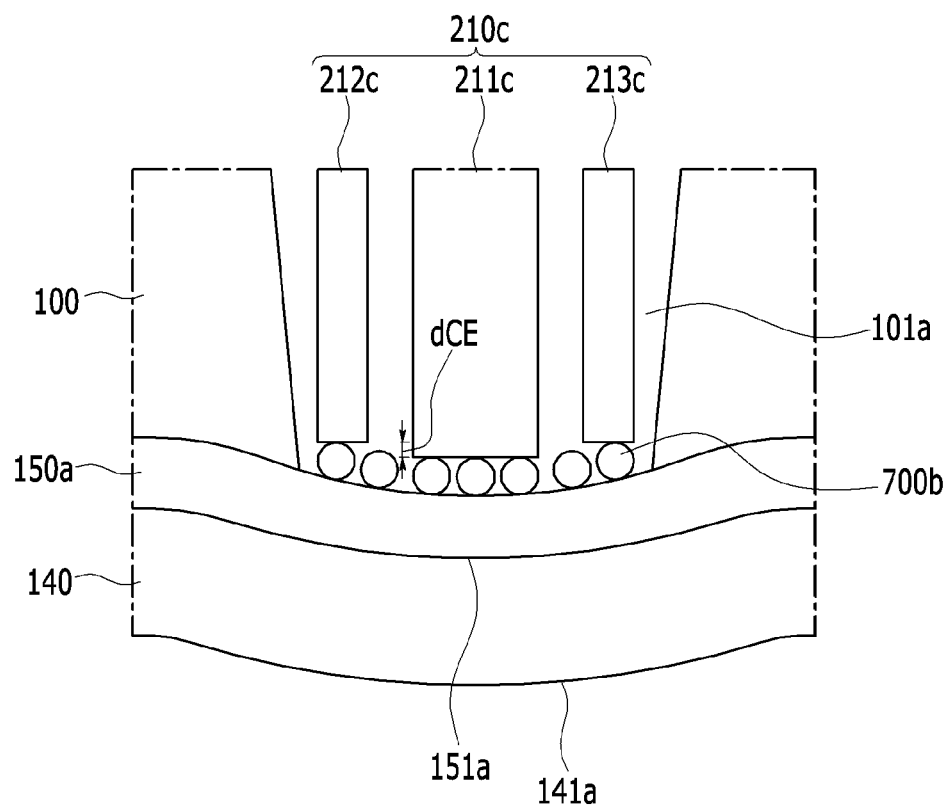
FIG. 5 is a diagram for describing the shape of a bump part according to a third exemplary embodiment.

FIG. 5 is a diagram for describing a form of a bump part according to a third exemplary embodiment.

Referring to FIG. 5, an enlarged of an area adjacent to an end portion of the first bump part 210c according to a third exemplary embodiment is shown.

The first bump part 210c can be divided into a first boundary part 212c, a central part 211c, and a second boundary part 213c. The height of the central part 211c of the first bump part 210c is greater than those of the first and second boundary parts 212c and 213c.

The central part 211c, which is a functional bump unit, performs an electrical connection role between the first pad part 150a and the data driving IC 200.

The first and second boundary parts 212c and 213c, which are dummy bump parts, perform a structural role, but do not perform an electrical connection role. That is, the first and second boundary parts 212c and 213c physically contact the conductive balls 700b and the first pad part 150a to physically support the data driving IC 200, but do not have electrical signals transferred thereto, in contrast to the central part 211c.

A difference dCE in height between the central part 211c and heights of the first and second boundary parts 212c and 213c can be less than the diameters of the conductive balls 700b. Here, the difference dCE in the heights can be about 5 µm or less.

Therefore, the degree of deformation in the first and second concave type bent parts 141a and 151a can be decreased and problems such as the contact defect 1001 and the disconnection defect 1002 can be prevented.

Figure 6:
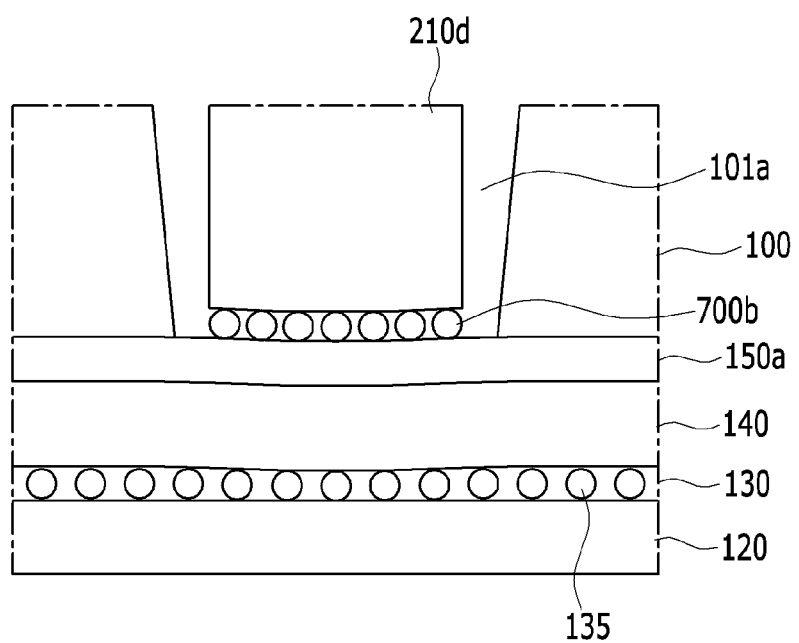
FIG. 6 is a diagram for describing a manufacturing process using an adhesive layer containing spacers.

FIG. 6 is a diagram for describing a manufacturing process using an adhesive layer containing a solid matter or a gel material. Although an area adjacent to an end portion of a first bump part 210d will be mainly described with reference to FIG. 6, it will be understood by those skilled in the art that the same process is performed in an area adjacent to an end portion of the second bump part 220.

First, the adhesive layer 130 is stacked on the manufacturing substrate 120 and the flexible insulation substrate 140 is stacked on the adhesive layer 130 so as to be fixed to the flexible insulation substrate 140.

The pad part 150a, the thin film transistor, and the like, are formed on the flexible insulation substrate 140. Here, when the display device is a liquid crystal display, pixel electrodes and common electrodes are further formed. Additionally, when the display device is an OLED display, OLEDs including anode electrodes and cathode electrodes are further formed.

The insulating layer 100 is formed on the pad part 150a. However, the insulating layer 100 may not have a single layer structure as described above, but may include a thin film encapsulating layer, and the like. When the insulating layer 100 has a multilayer structure, electrode layer(s) can be interposed between multiple layers.

Next, the insulating layer 100 is etched to include the opening 101a exposing the first pad part 150a.

Then, a circuit part or display driver including the first bump part 210d is formed on the insulating layer 100. Here, the first bump part 210d is placed in the opening 101a to thereby be electrically connected to the first pad part 150a.

The circuit part can include any kind of circuit parts including the bump part and is mounted on the display panel. Referring to FIG. 1, an illustrative circuit part includes the data driving IC 200, the gate driving IC 400, and the power supplying unit 500.

Here, the adhesive layer 130 can contain a solid matter or a gel material.

The bent part may be generated in the flexible insulation substrate 140 even though the manufacturing substrate 120 is rigid since deformation of the adhesive layer 130 can occur depending on the pressure when the first bump part 210d is placed in the opening 101a.

Therefore, when beads spacers 135, or the like, are added to the adhesive layer 130, even though the circuit part is compressed, the deformation of the adhesive layer is reduced, and the generation of the bent part in the flexible insulation substrate 140 is reduced.

The accompanying drawings and the detailed description are not intended to limit the meaning or limit the scope of the described technology stated in the claims, but are intended illustrate exemplary embodiments. Therefore, it will be understood by those skilled in the art that various modifications and other equivalent exemplary embodiments can be made from the described technology. Therefore, an actual technical protection scope of the inventive technology is to be defined by the claims.

While this inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display, comprising:
a flexible substrate including a first concave bent portion;
a pad formed over the first concave bent portion of the flexible substrate and including a second concave bent portion overlapping the first concave bent portion; and
a connection pin electrically connected to the second concave bent portion,
wherein the connection pin has a central portion and a boundary portion surrounding the central portion,
wherein the height of the central portion is greater than that of the boundary portion, and
wherein a surface of the central portion adjacent to the pad has a curvature that is less than that of a surface of the boundary portion adjacent to the pad.

2. The flexible display of claim 1, wherein the end of the connection pin that is connected to the second concave bent portion has a shape that is substantially the same as that of the second concave bent portion.

3. The flexible display of claim 1, further comprising a plurality of conductive particles interposed between the connective pin and the second concave bent portion.

4. The flexible display of claim 1, further comprising:
a plurality of conductive particles positioned on the second concave bent portion,
wherein a subset of the conductive particles are interposed between the second concave bent portion and the central portion so as to electrically connect the second concave bent portion to the central portion, and
wherein at least a portion of the boundary portion is spaced apart from the conductive particles.

5. The flexible display of claim 1, further comprising:
an insulating layer formed over the pad and including an opening overlapping the second concave bent portion,
wherein the connection pin is placed in the opening.

6. A flexible display, comprising:
a flexible substrate including a first concave bent portion;
a pad formed over the first concave bent portion of the flexible substrate and including a second concave bent portion overlapping the first concave bent portion; and
a connection pin electrically connected to the second concave bent portion,
wherein the connection pin has a central portion and a boundary portion surrounding the central portion,
wherein the height of the central portion is greater than that of the boundary portion, and wherein a surface of the central portion adjacent to the pad is substantially flat and wherein a surface of the boundary portion adjacent to the pad forms an oblique angle with the central portion.

7. The flexible display of claim 6, further comprising:
a plurality of conductive particles positioned on the second concave bent portion,
wherein a subset of the conductive particles are interposed between the second concave bent portion and the central portion so as to electrically connect the second concave type bent portion to the central portion, and
at least a portion of the boundary portion is spaced apart from the conductive particles.

8. A flexible display, comprising:
a flexible substrate including a first concave bent portion;
a pad formed over the first concave bent portion of the flexible substrate and including a second concave bent portion overlapping the first concave bent portion; and
a connection pin electrically connected to the second concave bent portion,
wherein the connection pin has a central portion and a boundary portion surrounding the central portion,
wherein the height of the central portion is greater than that of the boundary portion,
wherein the central portion and the boundary portion are formed so as to be spaced apart from each other, and
wherein the central portion is electrically conductive and the boundary portion is electrically insulative.

9. The flexible display of claim 8, further comprising:
a plurality of conductive particles positioned on the second concave bent portion,
wherein a difference in height between the central portion and the boundary portion is less than the diameter of the conductive particles.

* * * * *